(12) United States Patent
Butenhoff et al.

(10) Patent No.: US 10,879,823 B2
(45) Date of Patent: Dec. 29, 2020

(54) ELECTRIC MOTOR POWER CONTROL CIRCUITRY

(71) Applicant: Texas Instruments Incorporated, Dallas, TX (US)

(72) Inventors: Michael Edwin Butenhoff, Minnesota City, MN (US); Rakesh Raja, Allen, TX (US); Nicholas James Oborny, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 165 days.

(21) Appl. No.: 16/236,983

(22) Filed: Dec. 31, 2018

(65) Prior Publication Data
US 2020/0212830 A1   Jul. 2, 2020

(51) Int. Cl.
*H02P 7/285*   (2016.01)
*H03K 17/16*   (2006.01)

(52) U.S. Cl.
CPC ........... *H02P 7/285* (2013.01); *H03K 17/162* (2013.01)

(58) Field of Classification Search
CPC ............... H02M 5/225; H02M 7/4807; H02M 2007/4815; Y02B 70/1441
See application file for complete search history.

(56) References Cited

U.S. PATENT DOCUMENTS

| | | | |
|---|---|---|---|
| 2012/0212870 A1* | 8/2012 | Necco | H02H 11/002 361/86 |
| 2013/0043818 A1* | 2/2013 | Chang | H02P 6/26 318/400.34 |
| 2016/0209855 A1* | 7/2016 | Deboy | H02M 3/1588 |
| 2018/0034446 A1* | 2/2018 | Wood | H02M 1/08 |

* cited by examiner

*Primary Examiner* — Zoheb S Imtiaz
(74) *Attorney, Agent, or Firm* — John R. Pessetto; Charles A. Brill; Frank D. Cimino

(57) ABSTRACT

Enhanced motor power control circuitry is presented herein. In one implementation, a circuit includes power transistor elements in a half-bridge arrangement configured to selectively switch current for a phase of a motor according to control signals applied to corresponding gate terminals. The circuit also includes control circuitry configured to produce the control signals to achieve target states among the power transistor elements. The control signals have ramp rates determined based at least on polarities of the current through the power transistor elements during inactive states.

13 Claims, 5 Drawing Sheets

ELECTRIC MOTOR POWER CONTROL CIRCUITRY

BACKGROUND

Electric motor systems typically include various electronics to control and monitor operation of the motors. For example, direct current (DC) motors employ control electronics to direct current to and from motor windings, which might take the form of various circuit topologies. One example, topology, a half-bridge power stage topology may be used to control different DC motor types. These half-bridge topologies can include H-bridge, triple half-bridge, and dual H-bridge types, among others. Challenges can arise when using these topologies due to usage of switching elements, such as power metal oxide semiconductor field-effect transistor (MOSFETs).

Power MOSFETs have higher switching speeds than other switching technologies, such as insulated-gate bipolar transistors (IGBTs) or thyristors. However, power MOSFETs still have finite switching speeds, such as from an 'off' state to an 'on' state. Thus, these power MOSFETs or other switching elements can continue to conduct current during undesirable times, leading to power losses and associated heating. Circuits merely increase the switching speed of switching elements to attempt to reduce undesirable switching currents. However, this can lead to unwanted effects such as electrical ringing and electromagnetic interference (EMI) in many situations.

OVERVIEW

Enhanced motor power control circuitry is presented herein. In one implementation, a circuit includes power transistor elements in a half-bridge arrangement configured to selectively switch current for a phase of a motor according to control signals applied to corresponding gate terminals. The circuit also includes control circuitry configured to produce the control signals to achieve target states among the power transistor elements. The control signals have ramp rates determined based at least on polarities of the current through the power transistor elements during inactive states.

BRIEF DESCRIPTION OF THE DRAWINGS

While several implementations are described in connection with these drawings, the disclosure is not limited to the implementations disclosed herein.

DETAILED DESCRIPTION

Figure 1:
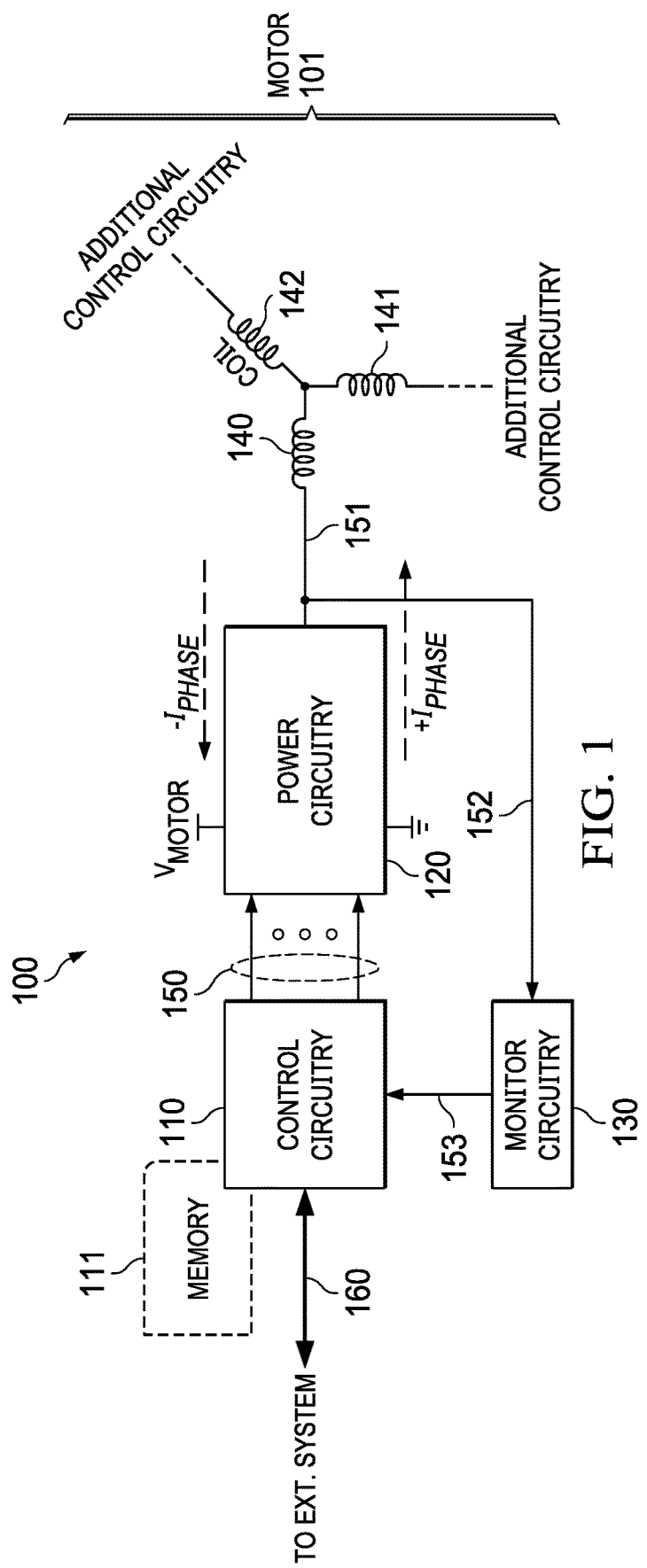
FIG. 1 illustrates a motor system in an implementation.

Motor control systems are discussed herein, which can be employed to control direct current (DC) motors, among other elements. Depending on the type of motor and configuration, one or more motor windings might be provided within a motor. Motor windings are employed in motors to provide rotary or linear motion, and these windings typically comprise wire coils, which are referred to herein as motor phases. Control systems control distribution of electrical current to and from motor windings. One example control circuit topology, a half-bridge power stage, includes control circuitry as well as power switching elements. These power switching elements can include metal oxide semiconductor field-effect transistor (MOSFETs), insulated-gate bipolar transistors (IGBTs), or thyristors, among other switching elements. Although the enhanced motor control circuitry discussed herein employs power MOSFETs, the enhanced circuitry can be applied to control other types of switching elements.

During transition times between 'on' and 'off' states, power transistors, such as power MOSFETs, can continue to conduct. This is due in part to the finite switching speeds achievable in the technology used for implementation of power transistors, as well as parasitic capacitance properties of the power transistors. The conduction of current during transition times might occur though body diode portions of the power transistors. These body diode portions are formed due to the particular construction of certain power transistors, such as power MOSFET devices. Control circuits might blindly increase a switching speed of switching elements to attempt to avoid inadvertent conduction during transition times. However, this can lead to undesirable effects such as electrical ringing, overshoot, and electromagnetic interference (EMI), among other drawbacks. There are two types of switching situations based upon the initial and final drain-to-source voltage, referred to herein as a "hard-switch" and a "soft-switch." In hard-switching, a power transistor is switched when both a non-zero current is presently flowing through the power transistor and when a non-zero voltage is present across drain and source terminals of the power transistor. In soft-switching, a power transistor is switched when a near-zero voltage is present across drain and source terminals of the power transistor prior to switching and after switching has completed. This near-zero voltage typically comprises a voltage drop of a corresponding body diode.

In the examples herein, switching rates of a half-bridge topology are adjusted based in part on a target switching state of switching elements and past polarity of the current through a motor phase. Selective control for hard-switching and soft-switching scenarios can thus be provided for enhanced control and operation of electric motors. A closed-loop system is provided which monitors a motor phase current polarity during half-bridge dead-time to determine the selected switching speed of the half-bridge. Dead-time refers to a time when both transistors of the half-bridge topology are off or in an inactive state. This enhanced operation is performed to increase the overall switching efficiency of the half-bridge without negative tradeoffs of increased electrical ringing or EMI. Increased power efficiency is also provided for the half-bridge due to reduced body diode conduction. This is due in part to faster switching speed selected during the soft-switch transitions, and slower, controlled transistor switching speed during the hard-switch transitions. Reduced transition lag to/from dead-time is also provided during the soft-switch transitions due to increased switching speeds.

As a first example of enhanced motor control circuitry, FIG. 1 is provided. FIG. 1 illustrates system 100 which provides power to one or more phase windings 140-142 (referred to as phases) of motor 101. System 100 comprises control circuitry 110, power circuitry 120, and phase monitor circuitry 130. Control circuitry 110 can communicate over link 160 with one or more external systems, such as to provide a programming interface for elements of system 100. In operation, control circuitry 110 instructs power circuitry 120 over one or more links 150 to switch current for motor phase 120. Power circuitry 120 thus provides electrical power over link 151 as sourced from $V_{MOTOR}$ to motor phase 120 as a portion of motor 101. The phase current ($I_{PHASE}$) can have either a positive or negative polarity in this example. Further control circuitry and power circuitry can be included for additional phases 141-142 of motor 101, or these phases might be controlled by elements of system 100. A monitoring control loop is provided in part by monitor circuitry 130 and links 152-153.

Control circuitry 110 comprises one or more processing elements and control circuits to instruct power control circuitry 120 to selectively source or sink current from phase 140 over link 151. Control circuitry 110 determines control voltages or control signals which couple to gate terminals of power transistor elements of power control circuitry 120. These control voltages or control signals can have associated ramp rates which are determined based in part on past/current switching states of power transistor elements of power control circuitry 120. The past/current switching states of the power transistor elements can be related to currents flowing through portions of the power transistor elements during an inactive state, or dead time when both power transistor elements are inactive or in an 'off' state.

Control circuitry 110 can be implemented using various microprocessors, control logic, programmable logic devices, discrete logic devices, or other devices and elements. Control circuitry 110 can also include gate driver circuitry which drives the gate terminals of the power transistor elements. This driver circuitry can include power amplifiers, gate drive transformers, DC-DC converter elements, or other circuit components to provide sufficient voltages to control gate terminals of associated power transistor elements. Moreover, control circuitry 110 can include memory 111 which can be employed to store indications of past switching states of power transistor elements of power control circuitry 120. These indications of the past switching states can inform control circuitry 110 how to perform ramping of control signals applied to power circuitry 120. Memory 111 might comprise static or dynamic random-access memory (RAM) devices, non-volatile or volatile memory devices, or other memory elements. In further examples, memory 111 might comprise sample-and-hold circuitry.

Power circuitry 120 comprises power transistor elements which act as power switching elements with regard to a motor phase, such as phase 140. Switching elements of power circuitry 120 are coupled between a voltage source, indicated in FIG. 1 as $V_{MOTOR}$, and a reference potential. Although various transistor circuit topologies might be employed by power circuitry 120, the examples herein comprise half-bridge topologies. Half-bridge power stage topologies can be used to control different motor types, such as DC motors. These half-bridge topologies can include H-bridge, triple half-bridge, and dual H-bridge types, among others.

A half-bridge power stage comprises two switching elements, such as power transistors. A first power transistor is coupled to a high potential, such as $V_{MOTOR}$, and is referred to herein as a "high-side" power transistor or "high-side" switching element. A second power transistor is coupled to a low potential, such as electrical ground, and is referred to herein as a "low-side" power transistor or "low-side" switching element. The first power transistor and second power transistor are also coupled to each other at a common output node. This common output node is shown as link 151 in FIG. 1, although various passive circuit elements might be positioned between the common output node and link 151. The high-side switching element also couples to the voltage source, while the low-side switching element also couples to the reference potential.

In the examples herein, the switching elements comprise power metal oxide semiconductor field-effect transistor (MOSFETs). Specifically, n-channel power MOSFETs are employed due to the lower on-resistance than p-channel power MOSFETS. Power MOSFETs comprise gate terminals, drain terminals, and source terminals for connection to external components. Additionally, power MOSFETs include "body diode" components which result from the structural formation of semiconductor connections internal to each power MOSFET. These body diode components or elements might continue to conduct current after a corresponding power MOSFET has been switched into an 'off' or inactive state. A further discussion of the operation of body diode components is found in FIG. 3 below.

Half-bridge power stage topologies can employ high-side and low-side power MOSFET devices. A high-side power MOSFET is coupled at a drain terminal to the voltage source ($V_{MOTOR}$), while a source terminal is coupled to the common output node of power circuitry 120. A low-side power MOSFET is coupled at a source terminal to the reference potential (e.g. electrical ground), while a drain terminal is coupled to the common output node of power circuitry 120. Gate terminals of the high-side MOSFET and low-side MOSFET are coupled via one or more links 150 to gate driver elements of control circuitry 110. Various passive or active circuit components might be provided in power circuitry 120 to support operation of the power MOSFETs, such as resistors, capacitors, inductors, voltage limiters, diodes, logic gates, or other elements.

Monitor circuitry 130 includes circuitry to detect a state or polarity of phase currents ($I_{PHASE}$) of phase 140. This detection might occur based on voltages present across switching elements of power circuitry 120 during 'on' and 'off' states of each switching element. Example circuit components include comparators, logic gates, voltage level conversion circuitry, and other various circuitry. Monitor circuitry 130 provides indications of the state of the switching elements or the state of the phase currents to control circuitry 110 over link 153. Control circuitry 110 might store these indications for use in determining ramp rates based on past switching states of power circuitry 120 or past polarities of the phase currents.

Figure 2:
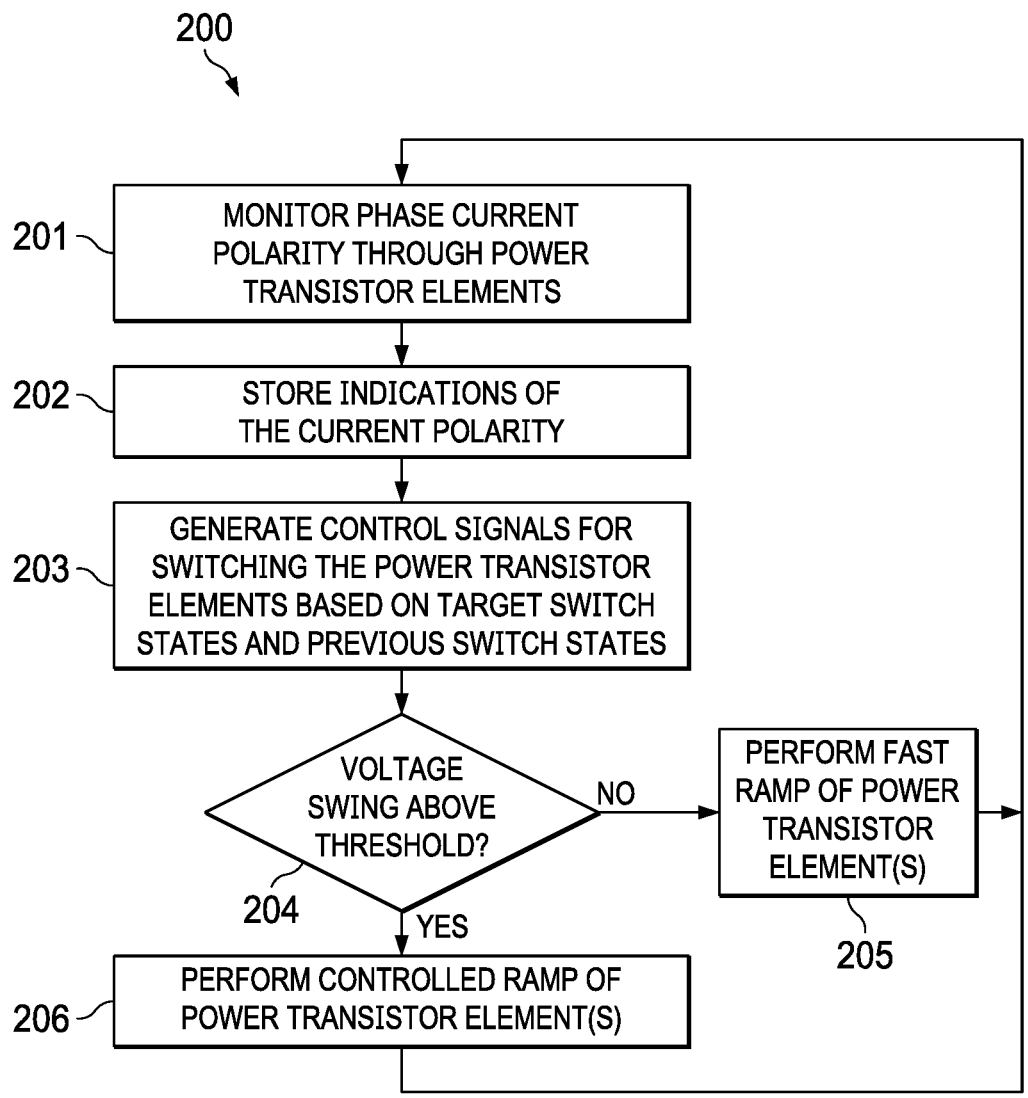
FIG. 2 illustrates an operation of a motor power control system in an implementation.

Turning now to an example operation of the elements of FIG. 1, FIG. 2 is provided. FIG. 2 is a flow diagram illustrating a method of operating system 100 in an implementation. In FIG. 2, power circuitry 120 provides power to phase 140 of motor 101 over link 151. This power might comprise a current ($I_{PHASE}$) having a positive or negative polarity, depending upon the particular switching states of power transistor elements internal to power circuitry 120. During operation of motor 101, monitor circuitry 130 monitors (201) motor phase current through power transistor elements, namely a polarity of $I_{PHASE}$. Monitor circuitry 130 can monitor operation of the power transistor elements by monitoring differences in voltages at link 152 as compared to $V_{MOTOR}$ and the reference potential. In this manner, monitor circuitry 130 determines a polarity of $I_{PHASE}$ during a dead time of the power transistor elements. This dead time is a period of time when all power transistor elements are in an inactive or 'off' state, and thus the power transistor elements are not conducting current through drain-to-source channels. Instead, the power transistor elements are passing $I_{PHASE}$ through other portions such as body diode portions when power MOSFETs are employed.

It can be difficult to directly determine the polarity of $I_{PHASE}$ through body diode portions of the power transistor elements, and thus an indirect measurement can be taken. This indirect measurement might take the form of monitoring switching states of the power transistor elements just prior to the dead time, e.g. determining which among the power transistor elements were in an 'on' state and which were in an 'off' state, as well as associated drain-to-source voltages prior to all power transistor elements entering an 'off' state. For example, $I_{PHASE}$ polarity can be determined by monitoring drain-to-source voltages across the power transistor elements to determine a positive or negative current polarity provided to the phase of the motor. After the dead time is entered, the polarity of $I_{PHASE}$ does not immediately change after both power transistor elements are in the 'off' state. $I_{PHASE}$ continues to flow with the polarity achieved just before the dead time, but through body diode portions of the power transistor elements instead of through any now-inactive channels of the power transistor elements.

After the polarity of $I_{PHASE}$ during the dead time is determined, monitor circuitry 130 indicates the polarity of $I_{PHASE}$ to control circuitry 110 over link 153. Link 153 might comprise a binary indicator link which reflects a polarity of $I_{PHASE}$, or might instead comprise a digital link indicating a digital value of the polarity, among other representations. After control circuitry 110 receives the indications of the polarity of $I_{PHASE}$, control circuitry 110 stores (202) indications of the polarity in memory 111.

Control circuitry 110 generates (203) control signals for switching the power transistor elements of power circuitry 120 based on target switch states and previous switch states. The stored indication of current polarity relates to the particular direction of $I_{PHASE}$ through the body diode portions of the power transistor elements during a dead time. The polarity of $I_{PHASE}$ also is related to switch states of the power transistor elements prior to dead time. The target switch state indicates a desired state into which one or more power transistor elements will be placed by control circuitry 110. Control circuitry 110 determines a voltage swing that will be handled by a particular power transistor element (204) to reach the target switch state, which might be above or below a particular voltage swing threshold. The amount of voltage swing that may be handled to achieve the target switch state corresponds to a switching speed applied to drive a power transistor element to an active state from an inactive state during the dead time.

If the voltage swing is below a predetermined threshold (205), then control circuitry 110 performs a fast ramp of power transistor element(s). This scenario is referred to as a "soft switch" scenario. When the voltage swing is low, such as approximately a voltage drop over from the body diode of an affected power transistor element ($V_{DIODE}$), then a fast transition of the affected power transistor element from an off state to an on or active state can be achieved. Control circuitry 110 will generate a control signal with a fast ramp to switch a power transistor element into an active or 'on' state in power circuitry 120. This fast switching can reduce switching losses in the affected power transistor element, without generating unwanted EMI or ringing due to the small voltage swing. Ramp rates for soft switching scenarios can vary by application and implementation, but an example might include 50 nanoseconds (ns) to 200 ns.

If the voltage swing is above predetermined threshold (206), then control circuitry 110 performs a controlled ramp of power transistor element(s). This scenario is referred to as a "hard switch" scenario. The controlled ramp is typically slower in speed than the fast ramp in operation 205. A much larger voltage swing may be accommodated when turning on an affected power transistor element, such as $V_{MOTOR}$ or $V_{MOTOR}+V_{DIODE}$ for an associated body diode. The slower transition into the 'on' state for the affected power transistor element produces less EMI and ringing than might normally be achieved if trying to switch the power transistor element as fast as possible or at a rate similar to operation 205. Ramp rates for hard switching scenarios can vary by application and implementation, but an example might include 100 ns to 6000 ns, or even slower. The ramp rate can also vary based on EMI requirements, motor current, cable length, and other factors.

The control signals are generated by control circuitry 110 which have ramp rates as determined in operations 205/206. Control circuitry 110 provides these control signals over one or more of links 150 in FIG. 1. The control signals might comprise control voltages which directly drive gate terminals of the power transistor elements of power circuitry 120. However, in many examples, gate driver circuitry is employed in either control circuitry 110 or power circuitry 120 to achieve appropriate gate voltage levels needed to switch the power transistor elements of power circuitry 120. Thus, control circuitry 110 can provide control signals which instruct or otherwise indicate to gate driver circuitry to produce gate voltages for the power transistor elements having the indicated ramp rates. Once the gate driver circuitry applies the gate voltages with associated voltage levels and ramp rates or speeds, the affected power transistor elements will responsively change state from an inactive state during the dead time to an active state. This active state allows the affected power transistor elements to conduct current through an active channel formed drain-to-source, and provide power to phase 140 of motor 101. A phase current of a particular polarity is generated by the switching of the affected power transistor elements, and the process indicated in FIG. 2 can continue again.

Although not shown in FIG. 2, a further operation with associated circuit elements might be included. This further operation can include determining the ramp rates among the fast and slow ramp rates. A predetermined or pre-programmed ramp rate for the fast and slow rates can be determined by control circuitry 110 and applied as-needed. However, adjustable ramp rates might also be employed. For example, a user interface or programming interface can be provided over link 160. This interface can allow adjustments to the ramp rates, definition of the 'fast' and 'slow' rates, and variations within pre-set ranges predefined for 'fast' and 'slow' rates, among other operations. Slew rates of the gate voltages or other parameters might also be adjusted over the programming interface. This programming interface, presented over link 160, might comprises one or more serial interfaces, such as inter-integrated circuit (IIC or I2C) interfaces. The programming interface might include one or more programmable registers within memory 111 or control circuitry 110 to store the programmable values received over link 160.

Figure 3:
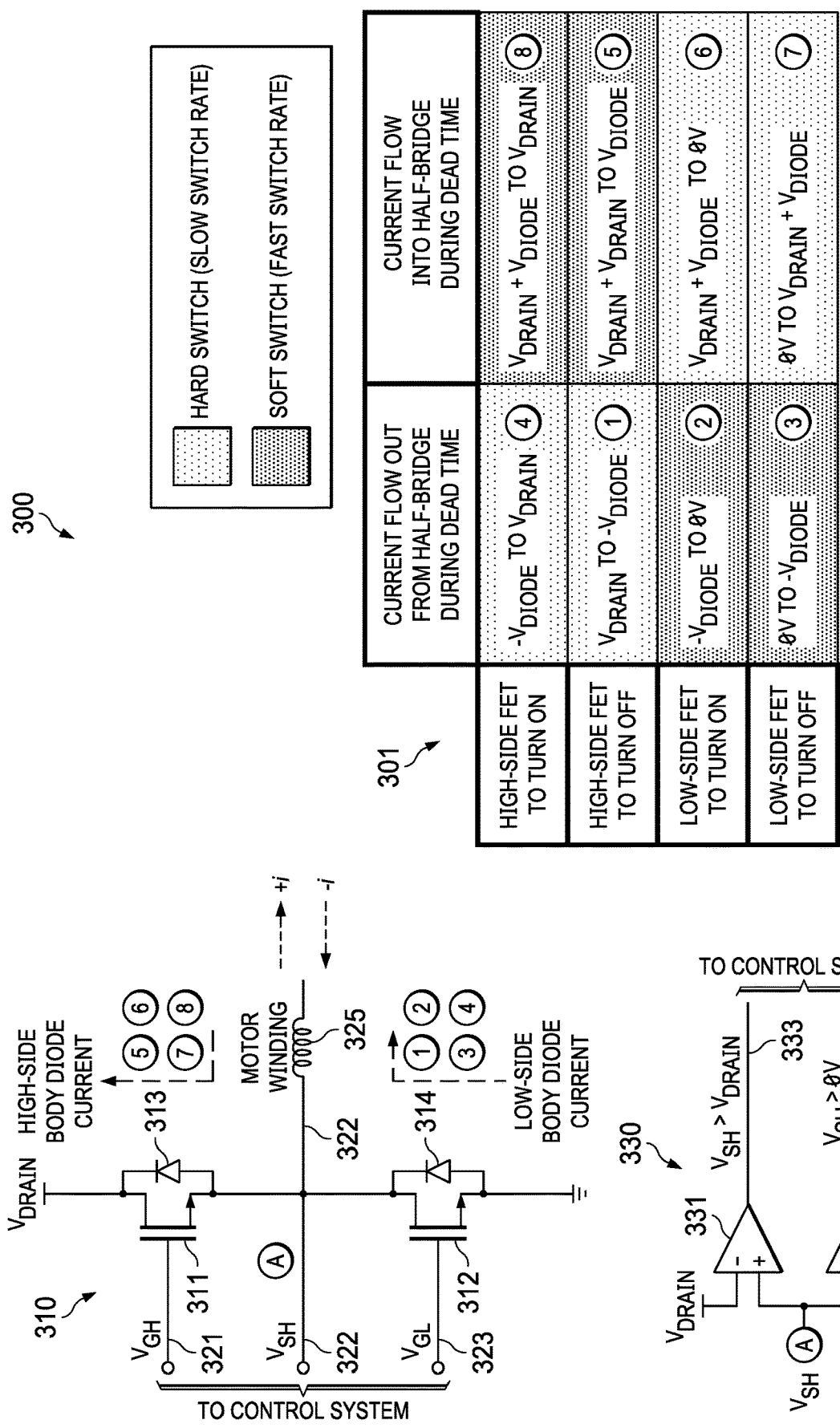
FIG. 3 illustrates a motor power control system in an implementation.

Turning now to a specific implementation of power circuitry 120, FIG. 3 is presented. FIG. 3 includes power switching circuit 300 as an example of power circuitry 120, although variations are possible. Circuit 300 includes a half-bridge topology 310 formed by two power MOSFET devices 311-312. MOSFET device 311 comprises the "high-side" (HS) device of the half-bridge, while MOSFET device 312 comprises the "low-side" (LS) device of the half-bridge. Each power MOSFET device also has a corresponding body diode 313-314. MOSFET device 311 is coupled at a drain terminal to a voltage source, referred to as $V_{DRAIN}$ in FIG. 3. MOSFET device 311 is coupled at a gate terminal ($V_{GH}$) to a control system, such as that discussed in FIG. 1 for control circuitry 110. MOSFET device 311 is coupled at a source terminal to a drain terminal of MOSFET device 312, which is also an output node of circuit 300. Output node 322 ($V_{SH}$) is coupled to a phase of a motor, shown as motor winding 325 in FIG. 3. MOSFET device 312 is coupled at a gate terminal ($V_{GL}$) to a control system, and at a source terminal to a voltage reference (electrical ground).

As mentioned above, terminals are coupled to a control system, not shown in FIG. 3 for clarity. Specifically, a gate terminal of MOSFET device 311 and a gate terminal of MOSFET device 312 are coupled over associated links 321 and 323 to a gate driver circuit. The common or shared node in the half-bridge arrangement, namely $V_{SH}$, also comprises an output node for the half-bridge. In operation, the half-bridge arrangement provides power to motor winding 325 in the form of electrical current. This electrical current has two polarities, namely a positive and negative polarity indicated. A positive current polarity is referred to in FIG. 3 as an outgoing current to motor winding 325, while an negative current polarity is referred to in FIG. 3 as an incoming current from motor winding 325. Various switch states among MOSFET devices 311-312 provide for sinking or sourcing the motor winding current and associated polarities. For example, when the high-side transistor is active, then current is supplied from $V_{DRAIN}$ through MOSFET device 311 to motor winding 325. Likewise, when the low-side transistor is active, the current is drawn to ground through MOSFET device 312.

However, once the associated MOSFET device enters an inactive state, such as by being turned off by a control system, the current which was previously being directed to or from motor winding 325 continues to flow. This is due in part to the nature of the inability of current to change instantaneously through an inductive device, such as motor winding 325, but also due to the presence of body diodes 313-314. Thus, when a positive current is being provided to motor winding 325, indicated by +i in FIG. 3, then that positive current continues to flow once the associated MOSFET device is turned off. Conversely, when a negative current is being drawn from motor winding 325, indicated by −i in FIG. 3, then that negative current continues to flow once the associated MOSFET device is turned off. The time period when both MOSFET devices are in the inactive state or turned off is referred to as the dead time. A current of a particular polarity continues to flow through a particular body diode depending upon the polarity of the current prior to the dead time. This polarity of the current before the dead time can be inferred by determined the switching configuration or switching state of the MOSFET devices, which depends in part on which MOSFET device is active and what voltages are present at node $V_{SH}$.

Circuit 330 in FIG. 3 is provided as an example circuit to detect the present state of the MOSFET devices and/or the present current polarity/direction. Specifically, circuit 330 includes two comparators 331-332 having sense terminals (+) coupled to node $V_{SH}$. A first comparator 331 has a reference terminal (−) coupled to $V_{DRAIN}$, while a second comparator 332 has a reference terminal (−) coupled to the reference potential. A first output 333 indicates when $V_{SH}$ is greater than $V_{DRAIN}$, while a second output 334 indicates when $V_{SH}$ is greater than the reference potential, or 0V. Outputs 333 and 334 can be used to determine a present current polarity for circuit 300 based on a comparison among node $V_{SH}$, the output node of circuit 300, to $V_{DRAIN}$ and ground. Outputs 333 and 334 are provided to a control system.

Once received, this control system can store these values for later usage in determining ramp rates for gate terminals of MOSFET devices 311-312 when needed to change into an active/on state or to an inactive/off state. Specifically, outputs 333 and 334 are first used to determine a polarity of the current through motor winding 325 during an active state, which can then be used to infer a current polarity though body diode portions of MOSFET devices 311-312 during a dead time. This current polarity through the body diode portions of MOSFET devices 311-312 is used in conjunction with a target switching state among MOSFET devices 311-312 to determine a ramp rate for associated gate terminals.

Table 301 is included in FIG. 3 to further illustrate this operation. Table 301 includes rows indicating a target switching state among MOSFET devices 311-312 in terms of desired high-side or low-side on/off states. Columns of table 301 indicate the current polarity during the dead time in terms of flowing out/in through circuit 300 to/from motor winding 325. A first column of table 301 relates to current flowing out of circuit 300 on link 322 to motor winding 325 (+i), while a second column of table 301 relates to current flowing into circuit 300 on link 322 from motor winding 325 (−i). Values within the particular cells or row/cell combinations of table 301 indicate a voltage swing which may be accommodated when the associated MOSFET device is turned on or off. Dark grey shading indicates that the voltage swing corresponds to a hard switch condition, while light grey shading indicates that the voltage swing corresponds to a soft switch condition. A hard switch condition might produce unwanted amounts of EMI or ringing due in part to the larger voltage swing, while a soft switch condition might generate less EMI or ringing due in part to a smaller voltage swing. Actual voltage values are provided in the cells of table 301. The voltage swings discussed herein relate to drain-to-source voltage swings when turning on or off a particular MOSFET device using an associated change in gate voltage.

To determine whether a hard switch condition or soft switch condition is encountered, a control system employs at least two data points. Specifically, (1) current polarity during a dead time through an associated body diode (columns of table 301) and (2) which selected MOSFET device is to be turned on or off, along with what the target state (on/off) is for selected the MOSFET device. From these data points, a hard/soft condition can be determined based in part on the associated voltage swing needed to achieve the target switch state. A hard switch condition will prompt the control system to employ a controlled or 'slow' switch rate, while a soft switch condition will prompt the control system to employ an uncontrolled or 'fast' switch rate. Actual switch rates will depend on the implementation, and relative terms are employed herein. Moreover, these switch rates relate to how fast/slow voltages are slewed to control gate terminals of the MOSFET devices.

Figure 4:
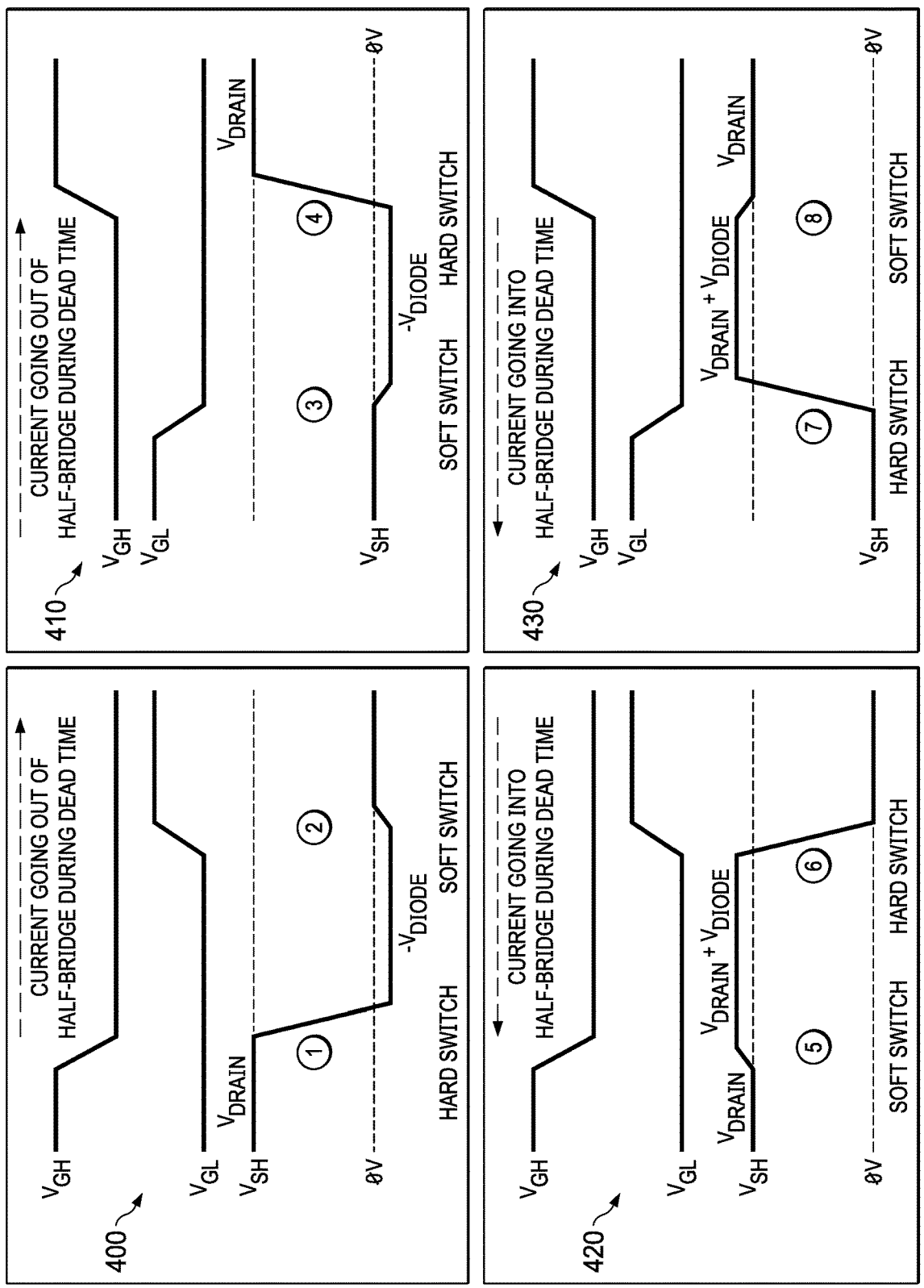
FIG. 4 illustrates example control voltages for a power control system in an implementation.

Table 301 and circuit 300 indicate eight (8) different scenarios among the different switching states, with each scenario associated with a different pair of target MOSFET device/state and dead time current polarity. Turning now to a detailed discussion on these eight scenarios, we refer to circuit 300 and table 301 of FIG. 3, as well as voltage/timing diagrams of FIG. 4. Several voltage/timing diagrams 400, 410, 420, and 430 are shown in FIG. 4, with each diagram relating to a different combination of initial on/off state and target on/off state of MOSFET devices 311-312. Numerical indicators 1-8 illustrate similar scenarios among circuit 300, table 301, and diagrams 400, 410, 420, and 430. For simplicity, MOSFET device 311 will be referred to as the high-side (HS or H) transistor or switch, while MOSFET device 312 will be referred to as the low-side (LS or L) transistor or switch. Gate voltages (G) for the high-side and low-side are referred to as $V_{GH}$ and $V_{GL}$, respectively. A voltage at output node 322 is referred to a $V_{SH}$, which includes a source (S) terminal of the high-side transistor (H). Diagrams 400, 410, 420, and 430 are merely representative of state changes, and the rates of change indicated in FIG. 4 are not necessarily reflective of the different ramp rates used to achieve state changes among the associated transistors. Specifically, ramp rates, ramp speeds, or slew rates shown for $V_{GH}$ and $V_{GL}$ are not shown to scale, and actual implementations will have hard switch ramp rates slower than soft switch ramp rates.

In scenario 1, indicated in diagram 400, $V_{GH}$ is initially in a 'high' state placing the high-side transistor into an active or 'on' state, while $V_{GL}$ is initially in a 'low' state placing the low-side transistor into an inactive or 'off' state. Scenario 1 shows the high-side transistor switching from the active state to the inactive state, and thus circuit 300 into the dead time when both high-side and low-side transistors are in the inactive state. $V_{GH}$ reflects this change in state of the high-side transistor. Diagram 400 indicates a voltage swing across the high-side transistor from $V_{DRAIN}$ to $-V_{DIODE}$, which can be determined from table 301 as related to the current expected to be flowing 'out' during the dead time. Based on this voltage swing, a hard switch condition is present, as shown for scenario 1 in table 301.

In scenario 2, indicated in diagram 400, $V_{GH}$ is initially in a 'low' state placing the high-side transistor into an inactive or 'off' state, while $V_{GL}$ is initially in a 'low' state placing the low-side transistor into an inactive or 'off' state. Scenario 2 shows the low-side transistor switching from the inactive state to the active state, and thus switching circuit 300 from the dead time when both transistors are off to a low-side active state. $V_{GL}$ reflects this change in state of the low-side transistor. Diagram 400 indicates a voltage swing across the low-side transistor from $-V_{DIODE}$ to 0V which can be determined from table 301 as related to the current expected to be flowing 'out' during the dead time. Based on this voltage swing, a soft switch condition is present, as shown for scenario 2 in table 301.

In scenario 3, indicated in diagram 410, $V_{GH}$ is initially in a 'low' state placing the high-side transistor into an active or 'off' state, while $V_{GL}$ is initially in a 'high' state placing the low-side transistor into an active or 'on' state. Scenario 3 shows the low-side transistor switching from the active state to the inactive state, and thus circuit 300 into the dead time when both high-side and low-side transistors are in the inactive state. $V_{GL}$ reflects this change in state of the low-side transistor. Diagram 410 indicates a voltage swing across the low-side transistor from 0V to $-V_{DIODE}$, which can be determined from table 301 as related to the current expected to be flowing 'out' during the dead time. Based on this voltage swing, a soft switch condition is present, as shown for scenario 3 in table 301.

In scenario 4, indicated in diagram 410, $V_{GH}$ is initially in a 'low' state placing the high-side transistor into an inactive or 'off' state, while $V_{GL}$ is initially in a 'low' state placing the low-side transistor into an inactive or 'off' state. Scenario 4 shows the high-side transistor switching from the inactive state to the active state, and thus switching circuit 300 from the dead time when both transistors are off to a high-side active state. $V_{GH}$ reflects this change in state of the high-side transistor. Diagram 410 indicates a voltage swing across the high-side transistor from $-V_{DIODE}$ to $V_{DRAIN}$ which can be determined from table 301 as related to the current expected to be flowing 'out' during the dead time. Based on this voltage swing, a hard switch condition is present, as shown for scenario 4 in table 301.

In scenario 5, indicated in diagram 420, $V_{GH}$ is initially in a 'high' state placing the high-side transistor into an active or 'on' state, while $V_{GL}$ is initially in a 'low' state placing the low-side transistor into an inactive or 'off' state. Scenario 5 shows the high-side transistor switching from the active state to the inactive state, and thus circuit 300 into the dead time when both high-side and low-side transistors are in the inactive state. $V_{GH}$ reflects this change in state of the high-side transistor. Diagram 420 indicates a voltage swing across the high-side transistor from $V_{DRAIN}$ to $V_{DRAIN+}V_{DIODE}$, which can be determined from table 301 as related to the current expected to be flowing 'in' during the dead time. Based on this voltage swing, a soft switch condition is present, as shown for scenario 5 in table 301.

In scenario 6, indicated in diagram 420, $V_{GH}$ is initially in a 'low' state placing the high-side transistor into an inactive or 'off' state, while $V_{GL}$ is initially in a 'low' state placing the low-side transistor into an inactive or 'off' state. Scenario 6 shows the low-side transistor switching from the inactive state to the active state, and thus switching circuit 300 from the dead time when both transistors are off to a low-side active state. $V_{GL}$ reflects this change in state of the low-side transistor. Diagram 420 indicates a voltage swing across the low-side transistor from $V_{DRAIN+}V_{DIODE}$ to 0V which can be determined from table 301 as related to the current expected to be flowing 'in' during the dead time. Based on this voltage swing, a hard switch condition is present, as shown for scenario 6 in table 301.

In scenario 7, indicated in diagram 430, $V_{GH}$ is initially in a 'low' state placing the high-side transistor into an active or 'off' state, while $V_{GL}$ is initially in a 'high' state placing the low-side transistor into an active or 'on' state. Scenario 7 shows the low-side transistor switching from the active state to the inactive state, and thus circuit 300 into the dead time when both high-side and low-side transistors are in the inactive state. $V_{GL}$ reflects this change in state of the low-side transistor. Diagram 430 indicates a voltage swing across the low-side transistor from 0V to $V_{DRAIN+}V_{DIODE}$, which can be determined from table 301 as related to the current expected to be flowing 'in' during the dead time. Based on this voltage swing, a hard switch condition is present, as shown for scenario 7 in table 301.

In scenario 8, indicated in diagram 430, $V_{GH}$ is initially in a 'low' state placing the high-side transistor into an inactive or 'off' state, while $V_{GL}$ is initially in a 'low' state placing the low-side transistor into an inactive or 'off' state. Scenario 8 shows the high-side transistor switching from the inactive state to the active state, and thus switching circuit 300 from the dead time when both transistors are off to a high-side active state. $V_{GH}$ reflects this change in state of the high-side transistor. Diagram 430 indicates a voltage swing across the high-side transistor from $V_{DRAIN+}V_{DIODE}$ to $V_{DRAIN}$ which can be determined from table 301 as related to the current expected to be flowing 'in' during the dead time. Based on this voltage swing, a hard switch condition is present, as shown for scenario 8 in table 301.

Thus, the preceding scenarios detail example switching states from initial states to target states among MOSFET elements 311-312. Depending upon the polarity of the current during the proximate dead time, a voltage swing occurs for the transistor going from an active state to an inactive state, or from an inactive state to an active state. The threshold discussed above in operation 204 thus might correspond to any voltage swing that is equal to or greater than $V_{DRAIN}$. When the voltage swing is expected to be $+/-V_{DRAIN}$ or greater, then the control system can perform a hard-switch using a controlled ramp rate for the associated gate control voltage. Likewise, when the voltage swing is expected to be less than $V_{DRAIN}$, then the control system can perform a soft-switch using an uncontrolled ramp rate for the associated gate control voltage.

Figure 5:
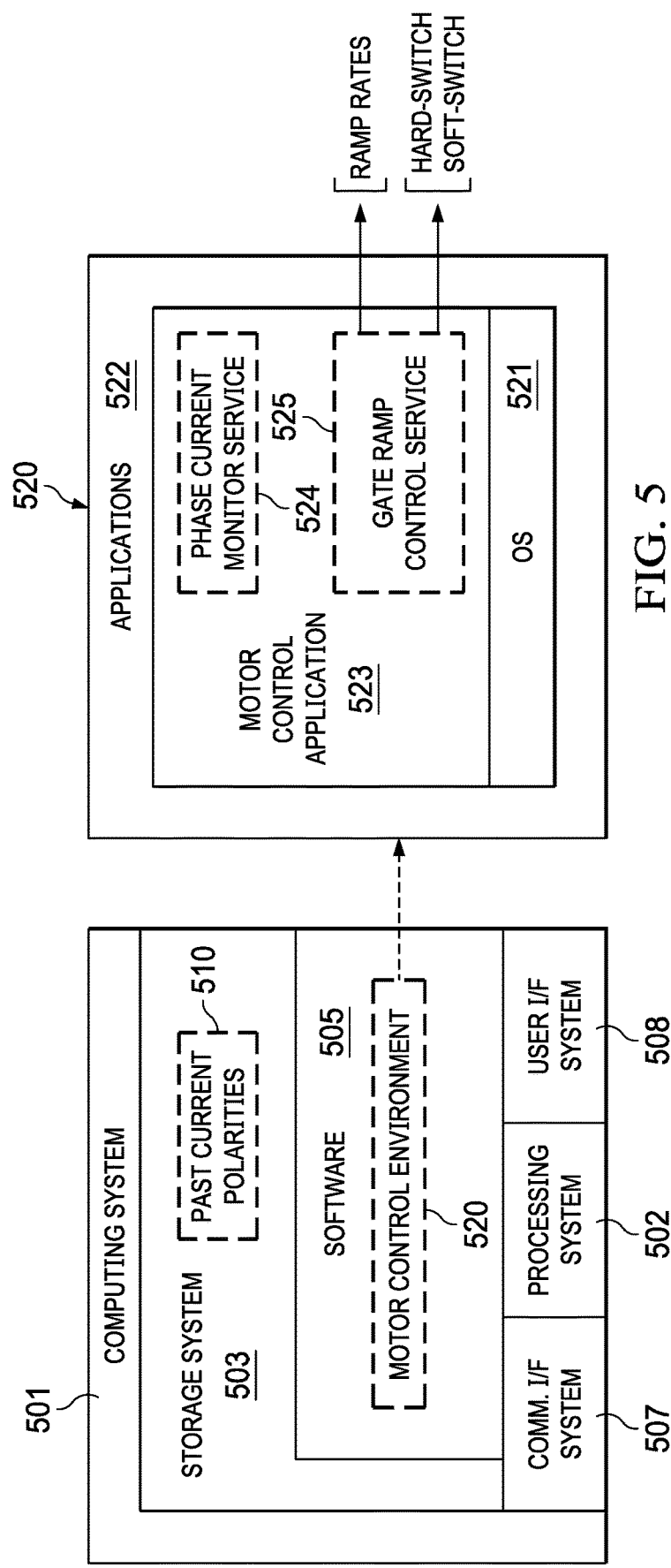
FIG. 5 illustrates a computing system to host or control motor power control circuitry according to an implementation.

In this manner, transistors in a half-bridge topology can be better controlled to change from active to inactive or from active to inactive states, while reducing EMI and ringing as well as the lag when transitioning states during soft-switch scenarios. Enhanced control circuitry and systems are discussed herein which control gate terminals or gate driver circuitry to switch associated power transistors according to the ramp rates appropriate for the particular state-switching scenario. FIG. 5 is now presented which might be used to implement portions of any control system or control and monitoring circuitry discussed herein.

FIG. 5 illustrates computing system 501 that is representative of any control system, monitor system, or collection of systems in which the various operational architectures, scenarios, and processes disclosed herein may be implemented. For example, computing system 501 can be used to implement control circuitry 110, monitor circuitry 130, or an external system of FIG. 1, control circuitry of FIG. 3, monitor circuitry 330 of FIG. 3, or any other instance of control circuitry, input circuitry, interface circuitry, or monitoring circuitry discussed herein. Moreover, computing system 501 can be used to store/load indications of motor phase current, and determine or configure power transistor gate driver ramp rates to establish one or more switching speeds of power transistors. In yet further examples, computing system 501 can fully implement a control and monitoring system, such as that illustrated in FIG. 1, to control switching of power circuitry 120 for at least one motor phase. Computing system 501 can implement control of any of the enhanced power circuitry operations discussed herein, whether implemented using hardware or software components, or any combination thereof.

Examples of computing system 501 include: computers, smartphones, tablet computing devices, laptops, desktop computers, hybrid computers, rack servers, web servers, cloud computing platforms, cloud computing systems, distributed computing systems, software-defined networking systems, and data center equipment, as well as any other type of physical or virtual machine, and other computing systems and devices, as well as any variation or combination thereof.

Computing system 501 may be implemented as a single apparatus, system, or device or may be implemented in a distributed manner as multiple apparatuses, systems, or devices. Computing system 501 includes: processing system 502, storage system 503, software 505, communication interface system 507, and user interface system 508. Processing system 502 is operatively coupled with storage system 503, communication interface system 507, and user interface system 508.

Processing system 502 loads and executes software 505 from storage system 503. Software 505 includes motor control environment 520, which is representative of processes discussed with respect to the preceding Figures. When executed by processing system 502 to implement and enhance power circuitry operations, software 505 directs processing system 502 to operate as described herein for at least the various processes, operational scenarios, and sequences discussed in the foregoing implementations. Computing system 501 may optionally include additional devices, features, or functionality not discussed for purposes of brevity.

Referring still to FIG. 5, processing system 502 may include a microprocessor and processing circuitry that retrieves and executes software 505 from storage system 503. Processing system 502 may be implemented within a single processing device, but may also be distributed across multiple processing devices, sub-systems, or specialized circuitry, that cooperate in executing program instructions and in performing the operations discussed herein. Examples of processing system 502 include general purpose central processing units, application specific processors, and logic devices, as well as any other type of processing device, combinations, or variations thereof.

Storage system 503 may include any computer readable storage media readable by processing system 502 and capable of storing software 505, and capable of optionally storing indications of past motor phase current polarities 510. Storage system 503 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, resistive storage devices, magnetic random-access memory devices, phase change memory devices, or any other suitable non-transitory storage media.

In addition to computer readable storage media, in another implementation storage system 503 may also include computer readable communication media over which at least portions of software 505 may be communicated internally or externally. Storage system 503 may be implemented as a single storage device, but may also be implemented across multiple storage devices or sub-systems co-located or distributed relative to each other. Storage system 503 may include additional elements, such as a controller, capable of communicating with processing system 502 or possibly other systems.

Software 505 may be implemented in program instructions and among other functions may, when executed by processing system 502, direct processing system 502 to operate as described with respect to the various operational scenarios, sequences, and processes illustrated herein. For example, software 505 may include program instructions for controlling and interfacing with enhanced in-memory multiplication circuitry, among other operations.

In particular, the program instructions may include various components or modules that cooperate or otherwise interact to carry out the various processes and operational scenarios described herein. The various components or modules may be embodied in compiled or interpreted instructions, or in other variations or combination of instructions. The various components or modules may be executed in a synchronous or asynchronous manner, serially or in parallel, in a single threaded environment or multi-threaded, or in accordance with any other suitable execution paradigm, variation, or combination thereof. Software 505 may include additional processes, programs, or components, such as operating system software or other application software, in addition to or that included in motor control environment 520. Software 505 may also comprise firmware or some other form of machine-readable processing instructions executable by processing system 502.

In general, software 505 may, when loaded into processing system 502 and executed, transform a suitable apparatus, system, or device (of which computing system 501 is representative) overall from a general-purpose computing system into a special-purpose computing system customized to facilitate controlling and interfacing motor phase power switching circuitry. Indeed, encoding software 505 on storage system 503 may transform the physical structure of storage system 503. The specific transformation of the physical structure may depend on various factors in different implementations of this description. Examples of such factors may include, but are not limited to, the technology used to implement the storage media of storage system 503 and whether the computer-storage media are characterized as primary or secondary storage, as well as other factors.

For example, if the computer readable storage media are implemented as semiconductor-based memory, software 505 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Motor control environment 520 includes one or more software elements, such as OS 521 and applications 522. These elements can describe various portions of computing system 501 with which elements of motor control systems or external systems can interface or interact. For example, OS 521 can provide a software platform on which application 522 is executed and allows for enhanced motor control operations and enhanced control and interfacing with power switching elements.

In one example, motor control application 523 comprises phase current monitor service 524 and gate ramp control service 525. Service 524 can monitor current polarities for motor phases, which might be in conjunction with external circuitry to which senses voltage levels or current directions. Service 524 might calculate current polarities based on monitored voltages among transistors and electrical nodes in a power control circuit. Service 525 determines when hard-switch or soft-switch scenarios are encountered, and determines appropriate ramp rates for switching transistor elements of a power control circuit. Hard-switch or soft-switch scenarios can be determined by service 525 based on monitored phase current and target switching states, with indications of past current polarities buffered or otherwise stored in a data structure represented by element 510. Service 525 might maintain a table or data structure of past switching states or past electrical current polarities in a memory for later use in determination of ramp rates needed to achieve desired or target switching states. Ramp rates can be pre-programmed/predetermined or might instead be user programmable over user interface system 508 or over communication interface 507.

Communication interface system 507 may include communication connections and devices that allow for communication with other computing systems (not shown) over communication networks (not shown). Communication interface system 507 might also communicate with portions of power switching circuitry, such as gate driver circuitry, power switching elements. Examples of connections and devices that together allow for inter-system communication may include discrete communication links, memory interfaces, network interface cards, antennas, power amplifiers, RF circuitry, transceivers, and other communication circuitry. The connections and devices may communicate over communication media to exchange communications or data with other computing systems or networks of systems, such as metal, glass, air, or any other suitable communication media.

In some examples, communication interface system 507 outputs control signals which instruct gate driver circuitry to provide gate control voltages to power switching transistors. In yet further examples, communication interface system 507 might receive monitored indications of current polarities or voltage states when external monitoring circuitry employed.

User interface system 508 is optional and may include a keyboard, a mouse, a voice input device, a touch input device for receiving input from a user. Output devices such as a display, speakers, web interfaces, terminal interfaces, and other types of output devices may also be included in user interface system 508. User interface system 508 can provide output and receive input over a data interface or network interface, such as communication interface system 507. User interface system 508 may also include associated user interface software executable by processing system 502 in support of the various user input and output devices discussed above. Separately or in conjunction with each other and other hardware and software elements, the user interface software and user interface devices may support a graphical user interface, a natural user interface, or any other type of user interface. User interface system 508 might present a programming interface or user interface which can accept programmable values for ramp rates, slew rates, voltage swing detection thresholds, or other variables to be applied to control power switching circuitry.

Communication between computing system 501 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

What is claimed is:

1. A circuit comprising:
   power transistor elements in a half-bridge arrangement configured to selectively switch current for a phase of a motor according to control signals applied to corresponding gate terminals; and
   control circuitry configured to produce the control signals to achieve target states among the power transistor elements, wherein the control signals have ramp rates determined based at least on polarities of the current through the power transistor elements during inactive states;
   wherein the polarities of the current through the power transistor elements during the inactive states relate to drain-to-source voltages to be handled across the power transistor elements to achieve the target states; and comprising:

for switching among states of a selected power transistor element, the control circuitry configured to determine a first ramp rate based on a first voltage transition to be handled across the selected power transistor element, and determine a second ramp rate slower relative to the first ramp rate based on a second voltage transition higher than the first voltage transition to be handled across the selected power transistor element.

2. The circuit of claim 1, comprising: the control circuit configured to determine the polarities of the current through the power transistor elements during the inactive states based at least in part on prior states of the power transistor elements.

3. The circuit of claim 2, comprising: one or more memory elements configured to store indications of the prior states of the power transistor elements.

4. The circuit of claim 1, wherein the power transistor elements in the half-bridge arrangement comprise: a first power metal oxide semiconductor field-effect transistor (MOSFET) coupled at a drain terminal to a voltage source and coupled at a source terminal to the phase of the motor; and a second power MOSFET coupled at a drain terminal to the phase of the motor and coupled at a source terminal to a reference potential.

5. The circuit of claim 4, wherein the current flows through corresponding body diode portions of the power transistor elements during the inactive states.

6. The circuit of claim 1, comprising: the control circuit configured to determine the polarities of the current through the power transistor elements during the inactive states by at least monitoring voltages present across each of the power transistor elements prior to entering the inactive states.

7. The circuit of claim 1, comprising: the control circuitry configured to adjust the ramp rates at least in part according to programmable rise or fall time indications received over a control interface.

8. A method of operating a control system, comprising:
transferring current for a phase of a motor according to control signals applied to corresponding gate terminals of power transistor elements in a half-bridge arrangement; and producing the control signals to achieve target states among the power transistor elements, wherein the control signals have ramp rates determined based at least on polarities of the current through the power transistor elements during inactive states;

wherein the polarities of the current through the power transistor elements during the inactive states relate to drain-to-source voltages to be handled across the power transistor elements to achieve the target states; and further comprising:

for switching among states of a selected power transistor element, determining a first ramp rate based on a first voltage transition to be handled across the selected power transistor element, and determining a second ramp rate slower relative to the first ramp rate based on a second voltage transition higher than the first voltage transition to be handled across the selected power transistor element.

9. The method of claim 8, further comprising: determining the polarities of the current through the power transistor elements during the inactive states based at least in part on prior states of the power transistor elements.

10. The method of claim 9, further comprising: storing indications of the prior states of the power transistor elements.

11. The method of claim 8, wherein the power transistor elements in the half-bridge arrangement comprise: a first power metal oxide semiconductor field-effect transistor (MOSFET) coupled at a drain terminal to a voltage source and coupled at a source terminal to the phase of the motor; and a second power MOSFET coupled at a drain terminal to the phase of the motor and coupled at a source terminal to a reference potential; and wherein the current flows through corresponding body diode portions of the power transistor elements during the inactive states.

12. The method of claim 8, further comprising: determining the polarities of the current through the power transistor elements during the inactive states by at least monitoring voltages present across each of the power transistor elements prior to entering the inactive states.

13. The method of claim 8, comprising: adjusting the ramp rates at least in part according to programmable rise or fall time indications received over a control interface.

* * * * *